(12) United States Patent
Komada

(10) Patent No.: US 8,350,278 B2
(45) Date of Patent: Jan. 8, 2013

(54) NITRIDE SEMICONDUCTOR LIGHT-EMITTING DEVICE

(75) Inventor: Satoshi Komada, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 12/950,747

(22) Filed: Nov. 19, 2010

(65) Prior Publication Data

US 2011/0127539 A1    Jun. 2, 2011

(30) Foreign Application Priority Data

Dec. 1, 2009  (JP) ................ 2009-273328

(51) Int. Cl.
*H01L 33/00* (2010.01)
*H01L 21/00* (2006.01)
(52) U.S. Cl. ..... 257/95; 257/98; 257/431; 257/E33.025; 257/E33.074; 438/29; 438/46
(58) Field of Classification Search .......... None
See application file for complete search history.

(56) References Cited

U.S. PATENT DOCUMENTS

| 7,012,281 | B2 * | 3/2006 | Tsai et al. ............ 257/99 |
| 7,187,007 | B2 * | 3/2007 | Kim et al. ............ 257/79 |
| 8,053,793 | B2 * | 11/2011 | Park et al. ............ 257/95 |
| 2003/0218179 | A1 * | 11/2003 | Koide et al. ............ 257/95 |
| 2005/0104080 | A1 * | 5/2005 | Ichihara et al. ............ 257/98 |
| 2005/0277218 | A1 | 12/2005 | Nakajo et al. |

FOREIGN PATENT DOCUMENTS

JP    2005-277374    10/2005

* cited by examiner

*Primary Examiner* — Alonzo Chambliss
(74) *Attorney, Agent, or Firm* — Morrison & Foerster LLP

(57) ABSTRACT

A nitride semiconductor light-emitting device includes an n type nitride semiconductor layer, a light-emitting layer formed on the n type nitride semiconductor layer, a first p type nitride semiconductor layer formed on the light-emitting layer, an intermediate layer formed on the first p type nitride semiconductor layer to alternately cover and expose a surface of the first p type nitride semiconductor layer, and a second p type nitride semiconductor layer formed on the intermediate layer. The intermediate layer is made of a compound containing Si and N as constituent elements.

7 Claims, 1 Drawing Sheet

NITRIDE SEMICONDUCTOR LIGHT-EMITTING DEVICE

This nonprovisional application is based on Japanese Patent Application No. 2009-273328 filed on Dec. 1, 2009 with the Japan Patent Office, the entire contents of which are hereby incorporated by reference.

BACKGROUND OF THE INVENTION

1. Field of the Invention

The present invention relates to a nitride semiconductor light-emitting device.

2. Description of the Background Art

Nitride semiconductors are very useful as a light-emitting device such as a light-emitting diode (LED) or a laser diode (LD) owing to their property of emitting light over a wide range that covers the entire region of visible light as well as the ultraviolet region. A nitride semiconductor light-emitting device mainly includes an n side electrode, an n type nitride semiconductor layer, a light-emitting layer, a p type nitride semiconductor layer, and a p side electrode.

One problem with a nitride semiconductor light-emitting device is that it is difficult to obtain a p type nitride semiconductor layer of high carrier concentration because activation energy of a p type dopant is high. Contact resistance between the p type nitride semiconductor layer and the p side electrode formed of metal, a translucent conductive layer or the like thus increases, resulting in a higher operating voltage of the nitride semiconductor light-emitting device.

Methods for solving this problem have conventionally been proposed. For the p type nitride semiconductor layer, it has been proposed to use p type InGaN that can be formed to have high carrier concentration as a layer in contact with the p side electrode, or to increase Mg concentration. For the p side electrode, it has been proposed to select a metal of high work function such as Pd or Ni when metal is used, or to devise annealing conditions after forming a translucent conductive layer when a translucent conductive layer is used.

Another problem with a nitride semiconductor light-emitting device is that in a light-emitting diode including a p type nitride semiconductor layer and a translucent conductive layer in contact with each other, total reflection may occur at a contact interface between them because a nitride semiconductor layer has a high refractive index of about 2.5, for example. This results in lower luminous efficiency.

In order to solve this problem, Japanese Patent Laying-Open No. 2005-277374 proposes a method of forming a concave-convex surface of a p type nitride semiconductor layer, which causes scattering and diffraction to reduce the amount of total reflection, thereby improving light extraction efficiency.

SUMMARY OF THE INVENTION

When p type InGaN is used as a contact layer, however, an InGaN layer is grown at low temperature, causing Mg serving as a p type dopant to be easily activated, and absorption to easily occur on a luminous wavelength. In addition, when Mg concentration is increased, carrier density may not be effectively increased due to a self-compensation effect. As a result, contact resistance between the p type nitride semiconductor layer and the p side electrode is not effectively reduced, or is increased instead.

Further, with the method described in Japanese Patent Laying-Open No. 2005-277374, the p type nitride semiconductor layer may be damaged at a mask removal step during formation of the concave-convex surface of the p type nitride semiconductor layer, resulting in increase in contact resistance.

In view of the circumstances stated above, an object of the present invention is to provide a nitride semiconductor light-emitting device having a low operating voltage. Another object of the present invention is to provide a nitride semiconductor light-emitting device having a low operating voltage and high degree of light extraction efficiency.

The present invention is directed to a nitride semiconductor light-emitting device including an n type nitride semiconductor layer, a light-emitting layer formed on the n type nitride semiconductor layer, a first p type nitride semiconductor layer formed on the light-emitting layer, an intermediate layer formed on the first p type nitride semiconductor layer to alternately cover and expose a surface of the first p type nitride semiconductor layer, and a second p type nitride semiconductor layer formed on the intermediate layer, the intermediate layer made of a compound containing Si and N as constituent elements.

Preferably, in the nitride semiconductor light-emitting device according to the present invention, the intermediate layer is patterned and formed by natural formation.

Preferably, in the nitride semiconductor light-emitting device according to the present invention, an upper surface of the second p type nitride semiconductor layer has a concave-convex shape.

In an example of the nitride semiconductor light-emitting device according to the present invention, the nitride semiconductor light-emitting device is a nitride semiconductor light-emitting diode device, and further includes a p side translucent conductive layer formed on the second p type nitride semiconductor layer.

Preferably, the p side translucent conductive layer includes at least one of indium tin oxide, tin dioxide, and zinc oxide.

Preferably, in the nitride semiconductor light-emitting device according to the present invention, a surface of the first p type nitride semiconductor layer which is in contact with the intermediate layer is a p type GaN layer.

Preferably, in the nitride semiconductor light-emitting device according to the present invention, a surface of the second p type nitride semiconductor layer which is in contact with the intermediate layer is a p type GaN layer.

Preferably, in the nitride semiconductor light-emitting device according to the present invention, the intermediate layer has a thickness of not more than 10 nm.

According to the present invention, a nitride semiconductor light-emitting device having a low operating voltage can be provided. Further, a nitride semiconductor light-emitting device having a low operating voltage and high degree of light extraction efficiency can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
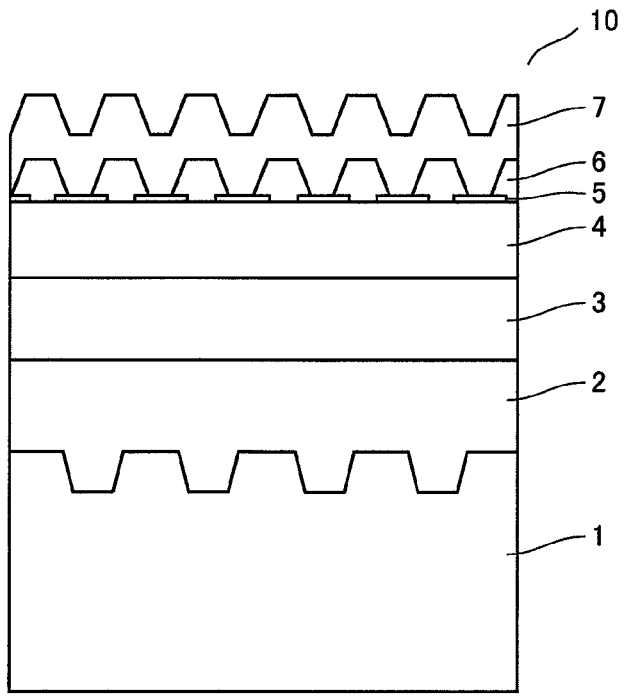
FIG. 1 is a schematic cross-sectional view showing a stack of a nitride semiconductor light-emitting diode device according to an embodiment of the present invention.

The present invention is directed to a nitride semiconductor light-emitting device including an n type nitride semiconductor layer, a light-emitting layer formed on the n type nitride semiconductor layer, a first p type nitride semiconductor layer formed on the light-emitting layer, an intermediate layer formed on the first p type nitride semiconductor layer to alternately cover and expose a surface of the first p type nitride semiconductor layer, and a second p type nitride semiconductor layer formed on the intermediate layer, the intermediate layer made of a compound containing Si and N as constituent elements.

An embodiment of the present invention will be described hereinafter with reference to the drawings. The structures illustrated in the drawings and the following description are for illustrative purposes, and the scope of the present invention is not limited to what is illustrated in the drawings and the following description. In the drawings of the present invention, the same reference characters indicate the same or corresponding parts. Further, in the drawings of the present invention, relations in terms of size such as length, width, and thickness are changed as appropriate for brevity and simplification of the drawings, and do not represent the actual relations in terms of size.

<Nitride Semiconductor Light-Emitting Device>

FIG. 1 is a schematic cross-sectional view showing a stack of a nitride semiconductor light-emitting diode device, which is a preferred example of the nitride semiconductor light-emitting device according to the present invention. A stack 10 includes a substrate 1, an n type nitride semiconductor layer 2 formed on substrate 1, a light-emitting layer 3 formed on n type nitride semiconductor layer 2, a first p type nitride semiconductor layer 4 formed on light-emitting layer 3, an intermediate layer 5 formed on first p type nitride semiconductor layer 4 to alternately cover and expose a surface of first p type nitride semiconductor layer 4, and a second p type nitride semiconductor layer 6 formed on intermediate layer 5. Intermediate layer 5 is made of a compound containing Si and N as constituent elements.

Intermediate layer 5 is formed on first p type nitride semiconductor layer 4 to alternately cover and expose the surface of first p type nitride semiconductor layer 4, and may be discretely formed on the surface of first p type nitride semiconductor layer 4, or may be formed as a layer having a plurality of apertures. A region of the surface of first p type nitride semiconductor layer 4 which is not covered with intermediate layer 5, namely, a region where intermediate layer 5 is not formed, or a region corresponding to the aperture of intermediate layer 5 is referred to as an "exposed region," and a region covered with intermediate layer 5 is referred to as a "covered region." First p type nitride semiconductor layer 4 and second p type nitride semiconductor layer 6 are in direct contact with each other in the exposed region, and are in contact with each other with intermediate layer 5 interposed therebetween in the covered region.

Each of n type nitride semiconductor layer 2, light-emitting layer 3, first p type nitride semiconductor layer 4, and second p type nitride semiconductor layer 6 is made of a nitride semiconductor. While such nitride semiconductor means a semiconductor representatively indicated as $Al_xGa_yIn_{1-x-y}N$ (both of x and y being not less than 0 and not more than 1), this is not restrictive. Any element for obtaining an n type or a p type nitride semiconductor may be added to the nitride semiconductor.

The components of the nitride semiconductor light-emitting diode device according to the present embodiment will be described hereinafter with reference to an example of a manufacturing method.

First, n type nitride semiconductor layer 2, light-emitting layer 3, first p type nitride semiconductor layer 4, intermediate layer 5, and second p type nitride semiconductor layer 6 are stacked in this order on a surface of substrate 1 by MOCVD (Metal Organic Chemical Vapor Deposition), for example.

(Substrate)

As substrate 1, various kinds of substrates such as a gallium nitride (GaN) substrate, a silicon carbide (SiC) substrate, a sapphire substrate, a spinel substrate, or a zinc oxide (ZnO) substrate may be used. It is preferable to use a sapphire substrate as substrate 1. The use of a sapphire substrate as substrate 1 can reduce the manufacturing costs of the nitride semiconductor light-emitting diode device according to the present embodiment, and allows stable manufacture of the nitride semiconductor light-emitting diode device according to the present embodiment.

The surface of substrate 1 on the side of n type nitride semiconductor layer 2 has a concave-convex shape. In a nitride semiconductor light-emitting diode device 10, the concave-convex surface of substrate 1 on the side of n type nitride semiconductor layer 2 causes a scattering effect and a diffraction effect of light that was generated by light-emitting layer 3 and traveled toward substrate 1, so that a large amount of light can be extracted to the outside. The concave-convex surface of substrate 1 can be formed by etching the surface of substrate 1 on the side of n type nitride semiconductor layer 2, for example. A plurality of concave portions are formed at intervals of not less than 0.05 μm and not more than 10 μm in the concave-convex surface of substrate 1, with each concave portion being formed to a depth of not less than 0.05 μm and not more than 10 μm, for example. A substrate having a plane surface may be used instead of substrate 1 having the concave-convex surface.

(N Type Nitride Semiconductor Layer)

N type nitride semiconductor layer 2 is not limited to a single layer, but may include a plurality of stacked layers. As n type nitride semiconductor layer 2, a low-temperature buffer layer, an AlN buffer layer, an undoped layer, or an n type doped layer may be used, for example. An undoped nitride semiconductor typically exhibits n type conductivity. Thus, an undoped nitride semiconductor layer may also be used as n type nitride semiconductor layer 2.

As an n type dopant introduced into the nitride semiconductor, Si, Ge or the like may be used. Particularly, in terms of reducing resistivity of n type nitride semiconductor layer 2, GaN, AlGaN, InAlGaN, or InGaN which may contain Si or no dopant layer may be used when n type nitride semiconductor layer 2 is a single layer. When n type nitride semiconductor layer 2 includes a plurality of layers, a stack structure such as InGaN/GaN, InGaN/AlGaN, AlGaN/GaN, or InGaN/InGaN may be used.

To form n type nitride semiconductor layer 2, first, substrate 1 is placed in an MOCVD device. Then, a temperature of substrate 1 is adjusted to be 1050° C., for example, and a carrier gas containing nitrogen and hydrogen is used to introduce a group III material gas, a doping gas containing the n type dopant, an ammonia gas and the like into the MOCVD device, to grow crystals of n type nitride semiconductor layer 2 on substrate 1.

As the group III material gas introduced into the device for forming n type nitride semiconductor layer 2, TMG $((CH_3)_3Ga$: trimethyl gallium), TEG $((C_2H_5)_3Ga$: triethyl gallium), TMA $((CH_3)_3Al$: trimethyl aluminum), TEA $((C_2H_5)_3Al$: triethyl aluminum), TMI $((CH_3)_3In$: trimethyl indium), or TEI $((C_2H_5)_3In$: triethyl indium) may be used, for example. When Si is used as the n type dopant, a $SiH_4$ (silane) gas may be used as a doping gas containing Si, for example.

(Light-Emitting Layer)

It is preferable that light-emitting layer 3 include a barrier layer made of GaN and a well layer made of a nitride semiconductor containing In. While an optimum thickness of the well layer varies with a wavelength of light emitted by the well layer, it is preferable that the thickness be in a range of 2 to 20 nm. The thickness of the well layer can be increased as crystalline quality of n type nitride semiconductor layer 2 increases. Such structure of light-emitting layer 3 is not limited to a quantum structure, but may be any of a single well structure, a multi-well structure, a multi-quantum-well structure and the like. The quantum structure means a structure when the well layer has a thickness of not more than 10 nm.

When light-emitting layer 3 includes a plurality of well layers, at least one of the well layers functions as a light-emitting layer. It is preferable that this well layer be made of $In_qGA_{1-q}N$ (0<q<1). A top layer of light-emitting layer 3 may be formed as an evaporation prevention layer for preventing evaporation of the well layers when growing first p type nitride semiconductor layer 4 to be subsequently stacked. It is preferable that the evaporation prevention layer be made of GaN or AlGaN.

Light-emitting layer 3 can be formed in the MOCVD device used for forming n type nitride semiconductor layer 2. Examples of a precursor of In supplied into the MOCVD device include TMI (trimethyl indium) and TEI (triethyl indium). The precursor is not limited to these materials, and may be any material containing In.

(First P Type Nitride Semiconductor Layer)

First p type nitride semiconductor layer 4 may either be a single layer or include a plurality of layers, and may be made of GaN, AlGaN, InAlGaN, or InGaN which is doped or undoped with a p type impurity. When p type nitride semiconductor layer 4 includes a plurality of layers, a stack structure such as InGaN/GaN, InGaN/AlGaN, AlGaN/GaN, or InGaN/InGaN may be used. It is preferable that a surface of first p type nitride semiconductor layer 4 which is in contact with intermediate layer 5 be p type GaN. It is preferable to use GaN in terms of preventing lowering of light extraction efficiency owing to its low absorption coefficient on a luminous wavelength, and reducing contact resistance with intermediate layer 5 directly thereon.

It is preferable that first p type nitride semiconductor layer 4 have a thickness of not more than 1500 nm. When p type nitride semiconductor layer 4 has a thickness of more than 1500 nm, light-emitting layer 3 is exposed to heat for a long time at high temperature. Light-emitting layer 3 is thus thermally deteriorated, which may increase a non-luminous region.

To form first p type nitride semiconductor layer 4, a temperature in the MOCVD device is adjusted to be a temperature of the stack suitable for crystal growth of a p type nitride semiconductor layer, and then a carrier gas containing nitrogen and hydrogen, a group III material gas, a doping gas containing a p type dopant, and an ammonia gas are introduced into the MOCVD device, thereby growing crystals of first p type nitride semiconductor layer 4.

When Mg is used as the p type dopant, Cp$_2$Mg (cyclopentadienyl magnesium) or (EtCp)$_2$Mg (bisethylcyclo-pentadienyl magnesium) may be used, for example, as the doping gas. Since (EtCp)$_2$Mg is liquid at atmospheric temperatures and pressures, (EtCp)$_2$Mg has better responsiveness when an amount of introduction thereof into the MOCVD device is changed, than Cp$_2$Mg which is solid under the same conditions. It is also easy to maintain a vapor pressure of (EtCp)$_2$Mg constant.

As the group III material gas and the ammonia gas used for forming first p type nitride semiconductor layer 4, the same types of gases as those used for forming n type nitride semiconductor layer 2 and light-emitting layer 3 may be used.

(Intermediate Layer)

Next, intermediate layer 5 is formed on first p type nitride semiconductor layer 4 to alternately cover and expose the surface of first p type nitride semiconductor layer 4. It is preferable that intermediate layer 5 be patterned and formed by natural formation. Intermediate layer 5 patterned by natural formation means an intermediate layer patterned and formed simultaneously with crystal growth, rather than an intermediate layer patterned and formed by partial removal with etching and the like after crystal growth.

Intermediate layer 5 is made of a compound containing Si and N as constituent elements. While intermediate layer 5 may also contain Mg, Al, Ga, In and the like as additional constituent elements, it is preferable to have a high mole ratio of Si. By adjusting conditions for crystal growth of such compound, intermediate layer 5 can be formed together with the crystal growth. Intermediate layer 5 can thus be formed without a removal step, thereby preventing increase in contact resistance that would be caused by damage done to a lower layer surface at the removal step. It is preferable that a formation temperature of intermediate layer 5 be such that the temperature on the stack is not more than 1000° C. in order to prevent thermal damage to light-emitting layer 3.

It is also preferable that intermediate layer 5 have a thickness of not more than 10 nm in a stack direction. Thin intermediate layer 5 of not more than 10 nm can be formed by using the compound described above. When a mask material such as SiO$_2$ is used, for example, light extraction efficiency is lowered since light reflection easily occurs due to a lower refractive index of the mask material than that of a nitride semiconductor, and an operating voltage become higher since series resistance increases due to the insulation properties of the mask material. Meanwhile, in the present invention, intermediate layer 5 can be formed to have a thickness of not more than 10 nm, which allows tunneling of photons (light) and carriers (electrons, holes), thereby avoiding the problems associated with the use of SiO$_2$.

The crystals of the compound containing Si and N as constituent elements can be formed in the MOCVD device or an MBE (Molecular Beam Epitaxy) device, and can be successively formed in the same device as that used for forming the other nitride semiconductor layers. Accordingly, the stack in a manufacturing process need not be exposed to the atmosphere, thereby avoiding problems such as adherence of a natural oxide film that would be caused by exposure to the atmosphere. A natural oxide film causes increase in contact resistance. Intermediate layer 5 made of SiN can be formed in the MOCVD device by simultaneously introducing a silane gas and ammonia into the device.

By the crystal growth of the compound containing Si and N as constituent elements, intermediate layer 5 can be formed by natural formation without using photolithography. With photolithography, it is difficult to control patterning accuracy on the order of nm, and it is particularly difficult to achieve a thickness of not more than 10 nm of intermediate layer 5 in the stack direction (thickness). In contrast, intermediate layer 5 formed by natural formation of the compound containing Si and N as constituent elements can be controlled on the order of several nm by adjusting formation conditions. Accordingly, intermediate layer 5 can be formed as desired, and second p type nitride semiconductor layer 6 stacked thereon can also be formed to have a desired concave-convex structure. Since second p type nitride semiconductor layer 6 can be formed to have a desired concave-convex structure, high degree of light extraction efficiency can be achieved.

Intermediate layer 5 blocks semiconductor growth from a lower layer and thus needs to have an aperture where intermediate layer 5 is not formed. A discrete level or density of the aperture of intermediate layer 5 can be adjusted by adjusting formation time of intermediate layer 5, for example. If the formation time is too short, intermediate layer 5 is not formed to a sufficient degree. If the formation time is too long, intermediate layer 5 completely covers the lower layer. It is suitable to employ intermediate formation time therebetween.

(Second P Type Nitride Semiconductor Layer)

Intermediate layer 5 is formed on the surface of first p type nitride semiconductor layer 4, and second p type nitride semiconductor layer 6 is further formed thereon. As described above, the surface of first p type nitride semiconductor layer 4 is divided into the exposed region and the covered region by intermediate layer 5. In the covered region, crystal growth of second p type nitride semiconductor layer 6 formed thereon is blocked. Thus, crystals of second p type nitride semiconductor layer 6 are not grown in the covered region. In the exposed region, on the other hand, the crystals of second p type nitride semiconductor layer 6 are grown in a vertical direction. The crystal growth that starts in the exposed region then spreads in a horizontal direction, and covers an upper portion of intermediate layer 5. In the upper portion of intermediate layer 5 which does not have a particular crystal orientation, single crystallization is facilitated, and dislocation hardly occurs in semiconductor layer 6 in this portion, thereby improving the crystalline quality of semiconductor layer 6. Alternatively, dislocation in first p type nitride semiconductor layer 4 is terminated by intermediate layer 5, and the dislocation turns to a horizontal direction after another nucleation process at the step of forming second p type nitride semiconductor layer 6, thereby reducing threading dislocation. As a result, the crystalline quality of second p type nitride semiconductor layer 6 is improved.

With the improved crystalline quality of second p type nitride semiconductor layer 6 as described above, second p type nitride semiconductor layer 6 can have a high carrier concentration of not less than $1 \times 10^{18}/cm^3$, to reduce contact resistance with a p side translucent conductive layer 7 formed thereon.

It is preferable that an upper surface of second p type nitride semiconductor layer 6 have a concave-convex shape. The upper surface having a concave-convex shape includes a case where only the upper surface has a concave-convex shape, or a case where discretely formed convex portions form a concave-convex shape as a whole. Second p type nitride semiconductor layer 6 is formed from the exposed region of first p type nitride semiconductor layer 4 to spread on the upper portion of intermediate layer 5, and can thus be formed to have a concave-convex shape by a usual process. With the concave-convex surface of second p type nitride semiconductor layer 6, high degree of light extraction efficiency can be achieved. The concave-convex shape of second p type nitride semiconductor layer 6 can be arbitrary altered by changing a growth time, a growth temperature of intermediate layer 5, a dopant concentration, a growth temperature, a V/III ratio (mole ratio of ammonia to a group III element), a thickness of second p type nitride semiconductor layer 6, or the like.

It is preferable that a scale of the concave-convex shape of second p type nitride semiconductor layer 6 have a pitch and a maximum height of not more than 10 μm, and even have a pitch and a maximum height far exceeding the luminous wavelength in order to achieve high degree of light extraction efficiency. It is preferable to have a pitch and a maximum height of not less than 10 nm in order not to cause tunneling of light.

Second p type nitride semiconductor layer 6 is not limited to a single layer, but may include a plurality of stacked layers. Such second p type nitride semiconductor layer 6 may include either a p type doped layer or a nitride semiconductor layer containing In, for example. It is most preferable that a surface of second p type nitride semiconductor layer 6 which is in contact with intermediate layer 5 be a p type GaN layer. A p type GaN layer is preferable in terms of having a wide range of conditions for forming a concave-convex structure, having a shape that can be readily controlled so that high degree of light extraction efficiency can be achieved with an optimum concave-convex design, and preventing lowering of light extraction efficiency owing to its low absorption coefficient on a luminous wavelength.

Second p type nitride semiconductor layer 6 can be formed in the MOCVD device by using a carrier gas containing nitrogen and hydrogen, a group III material gas, a doping gas containing a p type dopant, and an ammonia gas, which are the same types of gases as those used for forming first p type nitride semiconductor layer 4. It is preferable that the growth temperature of second p type nitride semiconductor layer 6 be such that the temperature on the stack is not more than 1000° C. in order to prevent thermal damage to light-emitting layer 3.

(P Side Translucent Conductive Layer)

Next, p side translucent conductive layer 7 is stacked on the surface of second p type nitride semiconductor layer 6 by sputtering or the like, to form stack 10.

P side translucent conductive layer 7, which is formed to cover the surface of second p type nitride semiconductor layer 6, reflects the shape of the surface of second p type nitride semiconductor layer 6, to have a concave-convex shape. P side translucent conductive layer 7 is in contact with second p type nitride semiconductor layer 6, and functions as a translucent electrode. Any material can be used for p side translucent conductive layer 7, without particularly being limited. Examples of the material include indium tin oxide (ITO), tin dioxide ($SnO_2$), zinc oxide (ZnO), titanium dioxide ($TiO_2$), a thin film metal electrode (such as Pd, Ni), and a nanowire metal electrode. It is preferable to use ITO, ZnO in terms of good conductivity, or $SnO_2$ in terms of good chemical stability. When second p type nitride semiconductor layer 6 under p side translucent conductive layer 7 is made of p type GaN, it is preferable to use ITO, $SnO_2$, ZnO which have low contact resistance with p type GaN.

(P Electrode, N Electrode)

Next, a portion of stack 10 of the nitride semiconductor light-emitting diode device shown in FIG. 1 is removed by etching or the like, to expose a portion of the surface of n type nitride semiconductor layer 2.

After that, an n side electrode is formed on the exposed surface of n type nitride semiconductor layer 2 and a p side electrode is formed on a surface of p side translucent conductive layer 7 by EB (Electron Beam) evaporation, for example, to complete the nitride semiconductor light-emitting diode device. As the p electrode and the n electrode, conventionally known electrodes made of Ti, Al, Au may be used, for example. The p electrode and the n electrode are not limited to have a single layer structure, but may include a multilayer structure.

In the nitride semiconductor light-emitting diode device fabricated as above, contact resistance between second p type nitride semiconductor layer 6 and p side translucent conductive layer 7 can be reduced, thereby lowering the operating voltage. Moreover, the concave-convex shape of second p type nitride semiconductor layer 6 causes scattering and diffraction of some light to reduce the amount of total reflection, thereby improving light extraction efficiency.

The nitride semiconductor light-emitting device according to the present invention is not limited as above, but may be formed in a different manner. For example, while the nitride semiconductor light-emitting device according to the present invention has been described only as a nitride semiconductor light-emitting diode, the nitride semiconductor light-emitting device may be formed as a nitride semiconductor laser.

The present invention will be described in more detail hereinafter with reference to an example, without being limited to this example.

Examples

Figure 2:
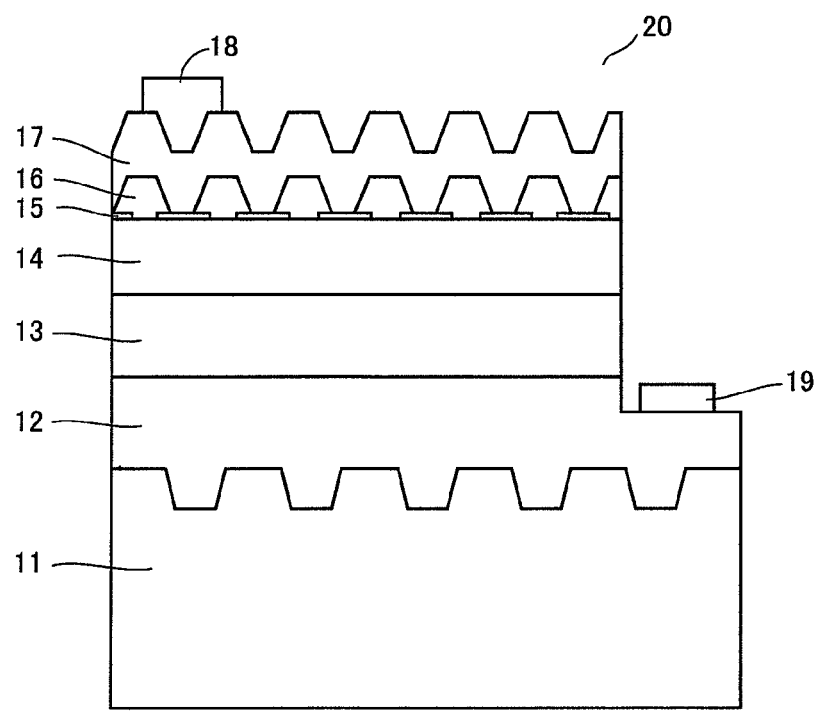
FIG. 2 is a schematic cross-sectional view of a nitride semiconductor light-emitting diode device fabricated in an example of the present invention.

FIG. 2 is a schematic cross-sectional view of a nitride semiconductor light-emitting diode device fabricated in the present example.

A nitride semiconductor light-emitting diode device 20 is fabricated by the following process. First, a sapphire substrate 11 formed to have a concave-convex shape is placed in an MOCVD device, and thermally cleaned at a substrate temperature of 1000° C. Then, a low-temperature buffer layer of 20 nm made of GaN is stacked at 600° C., an undoped GaN layer of 2 μm and an n-GaN layer of 3 μm doped with Si having an atomic concentration of $5 \times 10^{18}/cm^3$ are stacked in this order at 1000° C., to form an n type nitride semiconductor layer 12.

Then, an $In_{0.15}Ga_{0.85}N$ well layer of 2.5 nm and a GaN barrier layer of 8 nm are alternately stacked for six times at 750° C., to form a light-emitting layer 13. A top layer of light-emitting layer 13 is a GaN barrier layer, which also servers as an evaporation prevention layer of In. After that, $Al_{0.2}Ga_{0.8}N$ of 20 nm doped with Mg having an atomic concentration of $5 \times 10^{19}/cm^3$ and GaN of 80 nm doped with Mg having an atomic concentration of $5 \times 10^{19}/cm^3$ are successively stacked at 1000° C., to form a first p type nitride semiconductor layer 14. Then, silane and ammonia are supplied for 13 minutes at 900° C., to form an intermediate layer 15. Intermediate layer 15 has a thickness of about not more than 10 nm. After intermediate layer 15 is formed, a surface of first p type nitride semiconductor layer 14 is divided into an exposed region and a covered region.

Next, GaN doped with Mg having an atomic concentration of $5 \times 10^{19}/cm^3$ is stacked at 900° C., to form a second p type nitride semiconductor layer 16. While a height of convex portions of layer 16 is from 100 nm to 1 μm with a random pitch, a scale is approximately from 500 nm to 2 μm.

Next, the stack in the formation process is taken out of the MOCVD device, and ITO is stacked with a sputtering device to a thickness of 150 nm, to form a p side translucent conductive layer 17.

After that, a portion of a desired range of the stack is etched by RIE (reactive ion etching) with photolithography from a p side into the n-GaN layer of n type nitride semiconductor layer 12. Then, an n side pad electrode 19 made of Au/Ti/Al is formed on the n-GaN layer, and a p side pad electrode 18 made of Au/Ti/Al is formed on p side translucent conductive layer 17.

In nitride semiconductor light-emitting diode device 20, intermediate layer 15 facilitates formation of the concave and convex shape of second p type nitride semiconductor layer 16, and an interface between second p type nitride semiconductor layer 16 and p side translucent conductive layer 17 has a concave-convex shape, which is propagated such that an interface between p side translucent conductive layer 17 and resin or the air has a concave-convex shape. As a result, a light-emitting diode device having high degree of light extraction efficiency can be provided.

In addition, since second p type nitride semiconductor layer 16 can be formed to have a high carrier concentration, contact resistance between second p type nitride semiconductor layer 16 and p side translucent conductive layer 17 is not increased. As a result, a light-emitting diode device having a low operating voltage can be provided.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting device comprising:
   an n type nitride semiconductor layer;
   a light-emitting layer formed on said n type nitride semiconductor layer;
   a first p type nitride semiconductor layer formed on said light-emitting layer;
   an intermediate layer formed on said first p type nitride semiconductor layer to alternately cover and expose a surface of said first p type nitride semiconductor layer; and
   a second p type nitride semiconductor layer formed on said intermediate layer,
   said intermediate layer being made of a compound containing Si and N as constituent elements, and
   said second p type nitride semiconductor layer being separated into a plurality of convex portions that are physically separated from each other.

2. The nitride semiconductor light-emitting device according to claim 1, wherein said intermediate layer is patterned and formed by natural formation.

3. The nitride semiconductor light-emitting device according to claim 1, further comprising a p side translucent conductive layer formed on said second p type nitride semiconductor layer, wherein said nitride semiconductor light-emitting device is a nitride semiconductor light-emitting diode device.

4. The nitride semiconductor light-emitting device according to claim 3, wherein said p side translucent conductive layer includes at least one of indium tin oxide, tin dioxide, and zinc oxide.

5. The nitride semiconductor light-emitting device according to claim 1, wherein a surface of said first p type nitride semiconductor layer which is in contact with said intermediate layer is a p type GaN layer.

6. The nitride semiconductor light-emitting device according to claim 1, wherein
   a surface of said second p type nitride semiconductor layer which is in contact with said intermediate layer is a p type GaN layer.

7. The nitride semiconductor light-emitting device according to claim 1, wherein said intermediate layer has a thickness of not more than 10 nm.

* * * * *